United States Patent
Davis et al.

(10) Patent No.: US 10,541,342 B2
(45) Date of Patent: Jan. 21, 2020

(54) SENSOR WITH A PHOTOVOLTAIC CELL POWER SOURCE

(71) Applicant: Lenovo (Singapore) Pte. Ltd., Singapore (SG)

(72) Inventors: Mark Charles Davis, Durham, NC (US); Philip John Jakes, Durham, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 1643 days.

(21) Appl. No.: 14/258,219

(22) Filed: Apr. 22, 2014

(65) Prior Publication Data

US 2015/0300886 A1 Oct. 22, 2015

(51) Int. Cl.
*H01L 31/042* (2014.01)
*G01K 1/02* (2006.01)

(52) U.S. Cl.
CPC ............ *H01L 31/042* (2013.01); *G01K 1/024* (2013.01)

(58) Field of Classification Search
CPC ................. G01K 1/024; H01L 31/042; H01L 31/022466
See application file for complete search history.

(56) References Cited

U.S. PATENT DOCUMENTS

| | | | | |
|---|---|---|---|---|
| 6,518,944 | B1* | 2/2003 | Doane | G02F 1/13318 345/87 |
| 2007/0012349 | A1* | 1/2007 | Gaudiana | G06Q 30/00 136/244 |
| 2007/0084506 | A1* | 4/2007 | Ryan | B82Y 10/00 136/257 |
| 2010/0079711 | A1* | 4/2010 | Tanaka | G02F 1/13306 349/116 |
| 2013/0213475 | A1* | 8/2013 | Kimura | H01G 9/2027 136/259 |
| 2014/0116501 | A1* | 5/2014 | Gerardi | H01L 31/075 136/255 |
| 2014/0192311 | A1* | 7/2014 | Pletcher | G02C 7/04 351/158 |
| 2015/0199062 | A1* | 7/2015 | Lang | G06F 3/044 345/174 |
| 2015/0220299 | A1* | 8/2015 | Kim | G06F 3/0488 345/1.3 |
| 2015/0255651 | A1* | 9/2015 | Barr | G02F 1/13306 136/244 |

* cited by examiner

*Primary Examiner* — David M. Gray
*Assistant Examiner* — Geoffrey T Evans
(74) *Attorney, Agent, or Firm* — Ference & Associates LLC

(57) ABSTRACT

An embodiment provides a system, including: a sensor unit, comprising: a sensor that captures data; a memory storing data captured by the sensor; a photovoltaic cell operatively coupled to the sensor and the memory; the photovoltaic cell formed as a transparent layer; a display operatively coupled to the photovoltaic cell; a communication component that communicates the data captured by the sensor to a device; and a device that receives the data captured by the sensor via the communication component. Other aspects are described and claimed.

17 Claims, 4 Drawing Sheets

SENSOR WITH A PHOTOVOLTAIC CELL POWER SOURCE

BACKGROUND

Sensors are desirable to provide more information, e.g., regarding an environmental condition such as temperature, humidity, etc. Advances in integrated circuit technology and sensor design have made it possible to measure many physical parameters and display the information and/or transmit it to another device, e.g., wirelessly.

Often it is desirable to have sensors that have an on-board source of power, e.g., for remotely located environmental sensors or simply as a matter of convenience or cost savings (i.e., as opposed to wired sensors that derive power from a commercial power supply). In existing implementations, sensors have been produced for which the power requirements are below one (1) milliwatt (mw).

BRIEF SUMMARY

In summary, one aspect provides a device, comprising: a sensor that produced output; a circuit handling the output of the sensor; and a photovoltaic cell operatively coupled to the sensor and the circuit; the photovoltaic cell formed as a transparent layer.

Another aspect provides a method, comprising: disposing a layer of transparent photovoltaic cell material on a device; operatively coupling the layer of transparent photovoltaic cell material to a sensor and a circuit; and powering the sensor and the circuit using energy derived from the layer of transparent photovoltaic cell material.

A further aspect provides a system, comprising: a sensor unit, comprising: a sensor that captures data; a memory storing data captured by the sensor; a photovoltaic cell operatively coupled to the sensor and the memory; the photovoltaic cell formed as a transparent layer; a display operatively coupled to the photovoltaic cell; a communication component that communicates the data captured by the sensor to a device; and a device that receives the data captured by the sensor via the communication component.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

DETAILED DESCRIPTION

Figure 1:
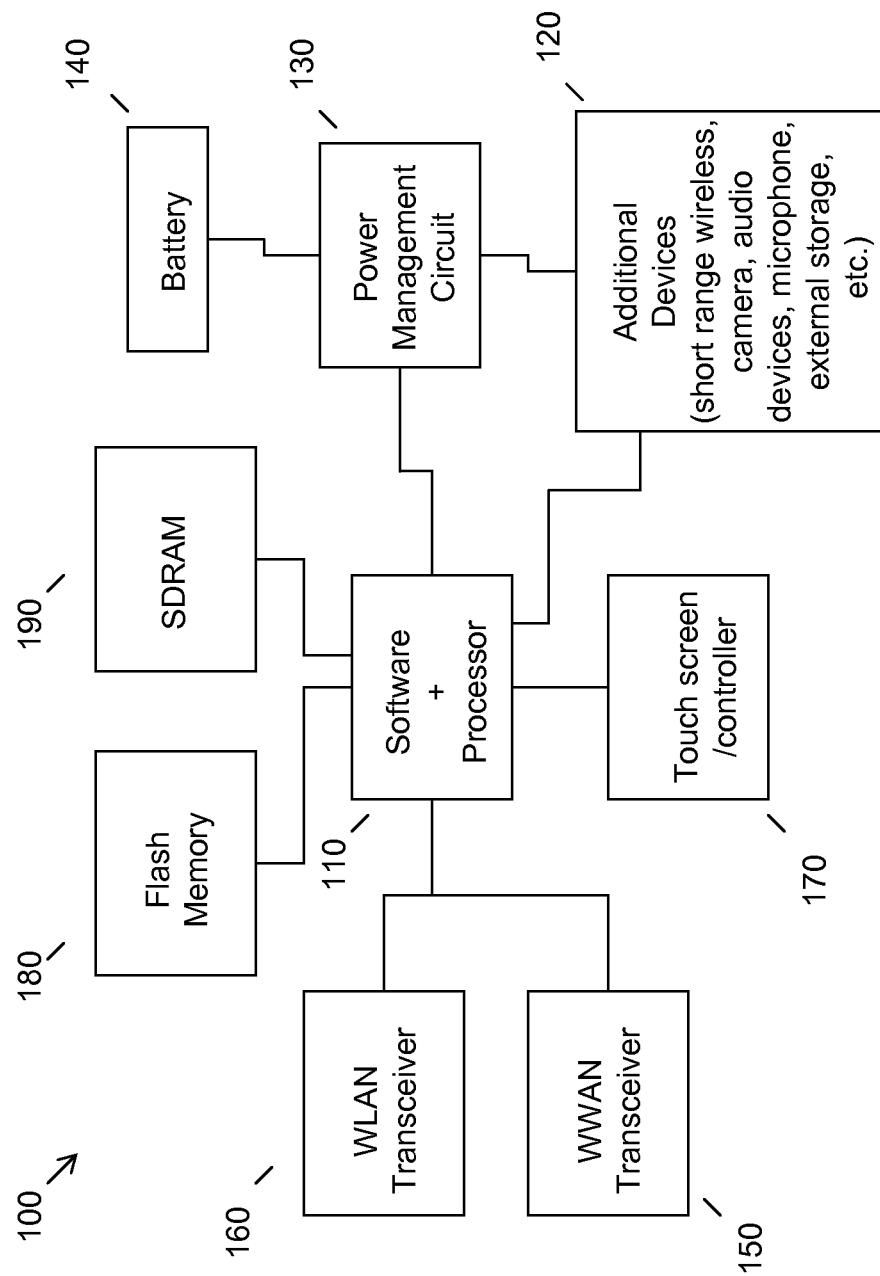
FIG. 1 illustrates an example of information handling device circuitry.

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

Current remote sensors and controls use batteries. The batteries have some physical problems, but most seriously they have limited lifespan. A common remote temperature module requires battery replacement about every six months. Often sensors that are not remotely located, e.g., controls such as a heating thermostat, are connected by wires and require external (commercial) power supplies. Such installations are expensive to install and very difficult to move.

Existing photo cells are available to provide a source of power for such sensors and related devices, but as separate components they greatly increase the cost of the device and also increase the surface area of the device. Materials for photovoltaic (PV) cells have been developed and some have been produced using transparent materials.

An embodiment utilized these transparent PV cells, which may take the form of a film or layer, produce sufficient power to operate a remote sensor. For example, a one inch by one inch PV cell may produce one (1) mw under strong indoor lighting conditions. An embodiment therefor provides a device constructed with a face (e.g., a glass face) using this transparent PV material. In an embodiment, utilization of such transparent PV material allows the device, e.g., an environmental sensor, to be self powered for a variety of applications.

In an embodiment, a small rechargeable battery or supercapacitor may be included to maintain operation even when light is unavailable, such as at night. An embodiment may further include a low power wireless communication component, e.g., a BLUETOOTH LE (also known as BLUETOOTH SMART) communication component, such that an economical and effective sensor may be constructed, e.g., to measure temperature and humidity. An embodiment may further include a low energy display, such as a reflective display including E-INK material, which may allow further capabilities to be realized, for example transforming the device into a digital thermometer or thermostat. Additionally, an energy efficient display may include a touch screen capability, e.g., as a separate layer or integrated with the transparent PV cell material, which then allows display of temperature and settings, along with a touch interface, in turn allowing changing the settings. This device could then function as a room thermostat and could be located anywhere in the room, e.g., as part of a larger system of devices.

An embodiment provides a system, e.g., in which several of such devices interact to provide indoor/outdoor temperature readings. Further, such a system may include another device, such as a higher powered device with additional capabilities, e.g., such that the other device may collect sensor data for further use. The higher powered device may include for example a sensor reading device, e.g., a thermostat main control unit which receives data from a lower powered environmental sensor, etc.

The illustrated example embodiments will be best understood by reference to the figures. The following description is intended only by way of example, and simply illustrates certain example embodiments.

While various other circuits, circuitry or components may be utilized in information handling devices (also referred to herein as apparatuses, electronic devices, or simply devices), with regard to low power circuitry 100, an example illustrated in FIG. 1 includes a system design found for example in smaller devices such as a tablet or other mobile computing platforms. Software and processor(s) are combined in a single circuit 110. Processors comprise internal arithmetic units, registers, cache memory, busses, I/O ports, etc., as is well known in the art. Internal busses and the like depend on different vendors, but essentially all the peripheral devices (120) may attach to a single circuit 110. The circuitry 100 combines the logic or a processor, memory control, and I/O controller hub all into a single circuit 110.

There may be separate power management chip(s) 130, e.g., a battery management circuit, which manage power as supplied, for example, via a rechargeable battery 140, which in turn may be recharged by a connection to a power source such as a transparent layer of PV cell material, as further described herein.

System 100 may include one or more of a WWAN transceiver 150 and a WLAN transceiver 160 for connecting to various networks, such as telecommunications networks and wireless Internet devices, e.g., access points. However, if a lower powered implementation is desired, additional devices 120 may be included or take the place of more power-intensive components, e.g., a short range wireless component such as BLUETOOTH LE component may be included. System 100 may include a touch screen 170, which may be a lower powered implementation using a power conserving material such as E-INK display materials, for data input and display/rendering. The touch screen 170 may of course be replaced or substituted with a simpler display, which again may be designed with lower power consumption in mind. System 100 may also include a memory device, e.g., flash memory 180 and/or SDRAM 190.

Figure 2:
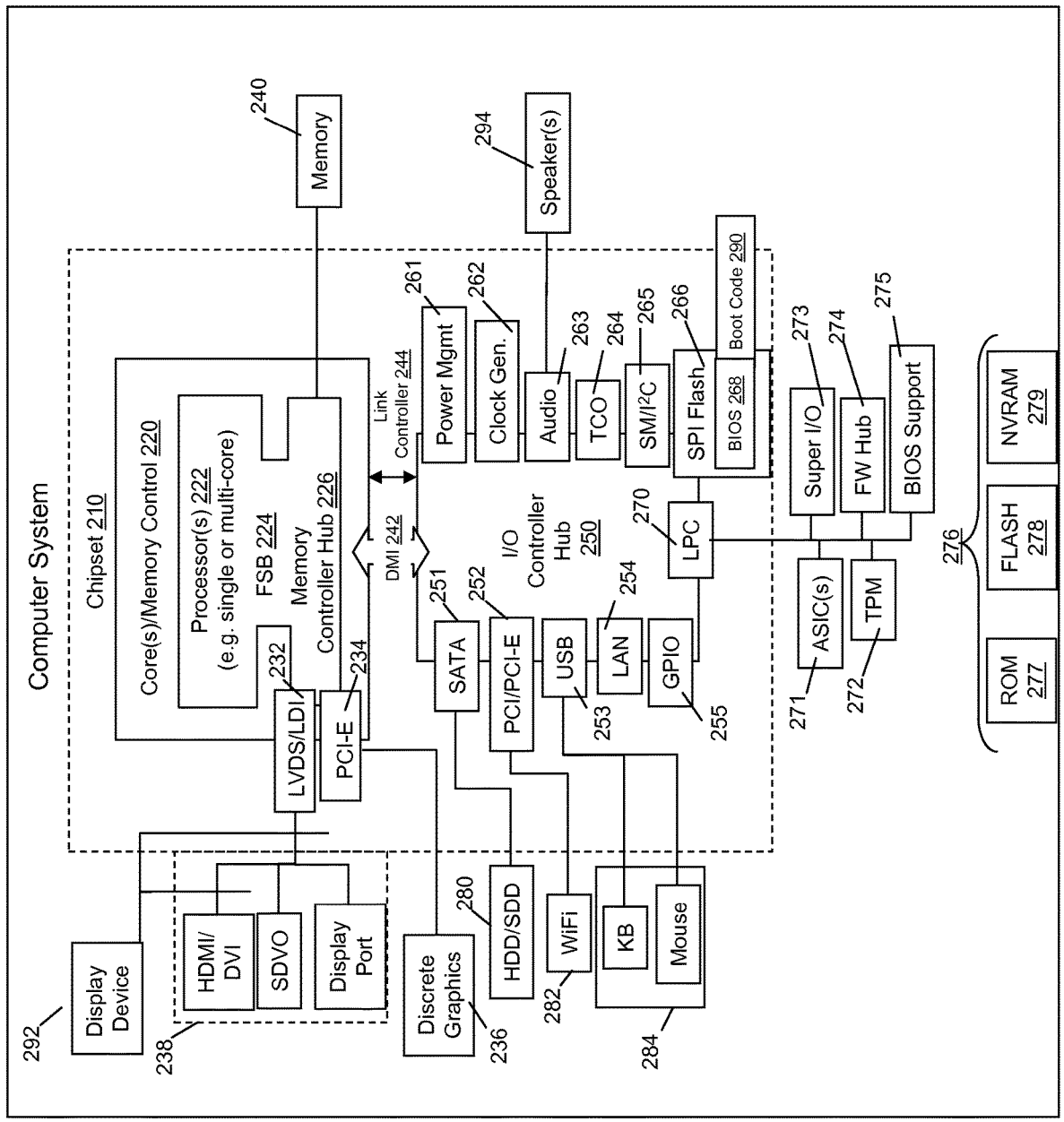
FIG. 2 illustrates another example of information handling device circuitry.

FIG. 2 depicts a block diagram of another example of information handling device circuits, circuitry or components. The example depicted in FIG. 2 may correspond to computing systems such as the THINKPAD series of personal computers sold by Lenovo (US) Inc. of Morrisville, NC, or other devices. As is apparent from the description herein, embodiments may include other features or only some of the features of the example illustrated in FIG. 2. The circuitry of FIG. 2 may be included in an embodiment, e.g., in a system implementation where a higher powered device, such as one including circuitry outlined in the example of FIG. 2, communicates with a lower powered sensor unit or device, e.g., including circuitry such as outlined in the example of FIG. 1.

The example of FIG. 2 includes a so-called chipset 210 (a group of integrated circuits, or chips, that work together, chipsets) with an architecture that may vary depending on manufacturer (for example, INTEL, AMD, ARM, etc.). INTEL is a registered trademark of Intel Corporation in the United States and other countries. AMD is a registered trademark of Advanced Micro Devices, Inc. in the United States and other countries. ARM is an unregistered trademark of ARM Holdings plc in the United States and other countries. The architecture of the chipset 210 includes a core and memory control group 220 and an I/O controller hub 250 that exchanges information (for example, data, signals, commands, etc.) via a direct management interface (DMI) 242 or a link controller 244. In FIG. 2, the DMI 242 is a chip-to-chip interface (sometimes referred to as being a link between a "northbridge" and a "southbridge"). The core and memory control group 220 include one or more processors 222 (for example, single or multi-core) and a memory controller hub 226 that exchange information via a front side bus (FSB) 224; noting that components of the group 220 may be integrated in a chip that supplants the conventional "northbridge" style architecture. One or more processors 222 comprise internal arithmetic units, registers, cache memory, busses, I/O ports, etc., as is well known in the art.

In FIG. 2, the memory controller hub 226 interfaces with memory 240 (for example, to provide support for a type of RAM that may be referred to as "system memory" or "memory"). The memory controller hub 226 further includes a LVDS interface 232 for a display device 292 (for example, a CRT, a flat panel, touch screen, etc.). A block 238 includes some technologies that may be supported via the LVDS interface 232 (for example, serial digital video, HDMI/DVI, display port). The memory controller hub 226 also includes a PCI-express interface (PCI-E) 234 that may support discrete graphics 236.

In FIG. 2, the I/O hub controller 250 includes a SATA interface 251 (for example, for HDDs, SDDs, etc., 280), a PCI-E interface 252 (for example, for wireless connections 282), a USB interface 253 (for example, for devices 284 such as a digitizer, keyboard, mice, cameras, phones, microphones, storage, other connected devices, etc.), a network interface 254 (for example, LAN), a GPIO interface 255, a LPC interface 270 (for ASICs 271, a TPM 272, a super I/O 273, a firmware hub 274, BIOS support 275 as well as various types of memory 276 such as ROM 277, Flash 278, and NVRAM 279), a power management interface 261, a clock generator interface 262, an audio interface 263 (for example, for speakers 294), a TCO interface 264, a system management bus interface 265, and SPI Flash 266, which can include BIOS 268 and boot code 290. The I/O hub controller 250 may include gigabit Ethernet support.

The system, upon power on, may be configured to execute boot code 290 for the BIOS 268, as stored within the SPI Flash 266, and thereafter processes data under the control of one or more operating systems and application software (for example, stored in system memory 240). An operating system may be stored in any of a variety of locations and accessed, for example, according to instructions of the BIOS 268. As described herein, a device may include fewer or more features than shown in the system of FIG. 2.

Circuitry, as for example outlined in FIG. 1 or FIG. 2, may be used in devices for providing a sensor and/or may be included in a system. Thus, for example, circuitry (or part thereof) such as outlined in FIG. 1 may be included in a low power sensor.

Figure 3:
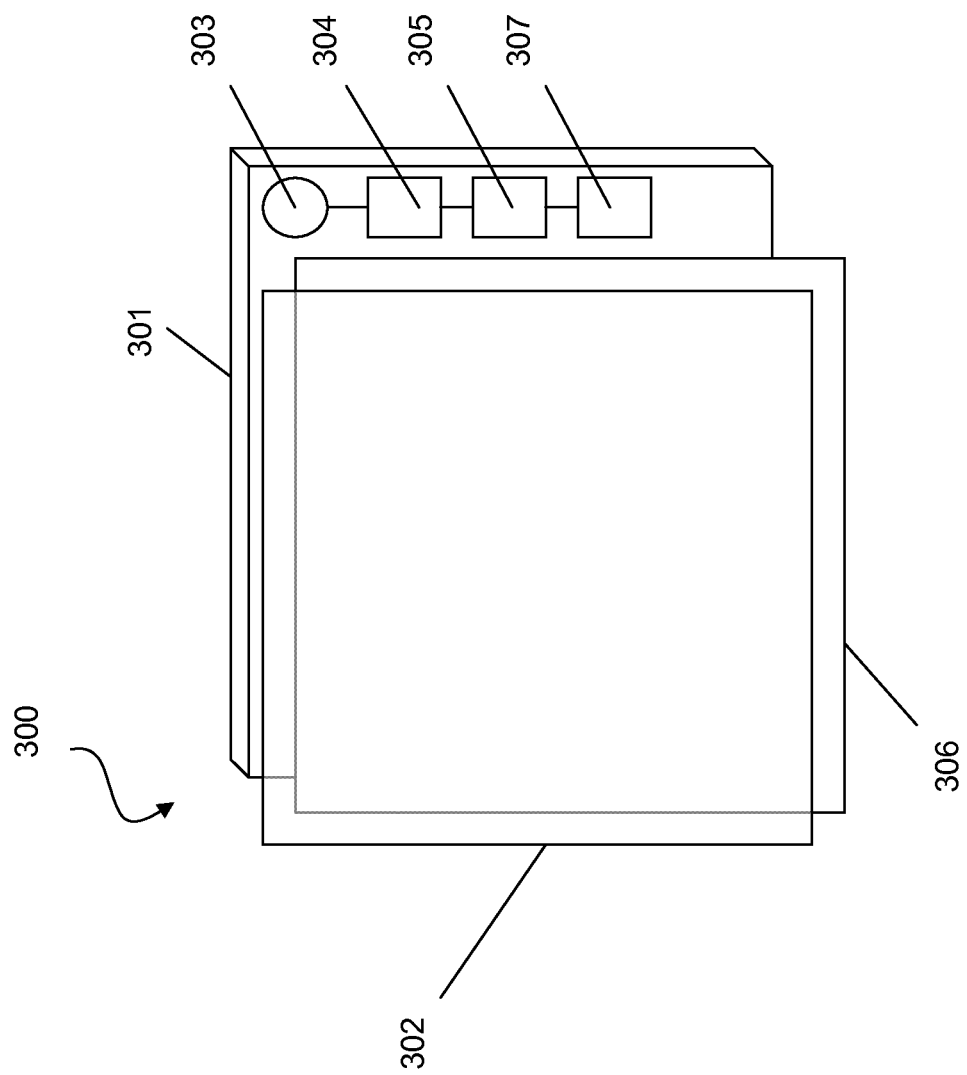
FIG. 3 illustrates an exploded view of an example sensor with a photovoltaic power source.

Referring to FIG. 3, an example of a sensor with a PV cell power source is illustrated. As shown, a sensor unit 300 may include a device 301 that houses a sensor 303 that captures data. The unit 300 may include a memory 304 storing data captured by the sensor 303. As described herein, a PV cell 302, here illustrated as a layer, may be operatively coupled to the sensor 303 and the memory 304.

The PV cell 302 formed as a transparent layer may overlay a display 306 operatively coupled to the PV cell 302. Thus, the display 306, when the unit 300 is assembled, may be coincident with the PV cell 302 formed as a transparent layer. This permits the PV cell 302 to derive and provide energy from a light source while not obstructing the contents of the underlying display 302. As described herein, the display 306 may be formed using low power materials, e.g., a reflective display material. The display 306, while being lower power, may also include data input capability, e.g., the display 306 may include a touch screen display. In an embodiment, the PV cell 302 may form part of the display 306.

The unit 300 may further include a rechargeable power storing unit 305 operatively coupled to the PV cell 302. This allows power derived from the PV cell 302 to be stored in the power storing unit 305, e.g., a rechargeable battery or a super-capacitor, and to be utilized even during times when the PV cell 302 is not producing energy, e.g., overnight or in low light conditions.

The unit 300 may further include a communication component 307 operatively coupled to the PV cell 302 and at least one of the sensor 303 and the memory 304. The communication component 307 may be a communication port for accepting a wired connection and/or may include a transmission component, e.g., a wireless communication component. In an embodiment, a wireless communication component 307 may be used to transmit data captured by the sensor 303 to at least one other device, as further described in connection with FIG. 4. For example, the sensor 303 may be an environmental sensor, such as a sensor that captures temperature data and/or humidity data which is communicated to another device for further processing.

The unit 300 may be formed by disposing a layer of transparent PV cell material 302 on a device 301; although in an embodiment the PV cell material 302 may be considered the device 300 itself. In an embodiment, the layer of transparent photovoltaic cell material 302 may be operatively coupled to a sensor 303 and a memory 304. The sensor 303 and the memory 304 may thus be powered using energy derived from the layer of transparent PV cell material 302.

In operation, for example, the sensor 303 may capture environmental data that is then stored in the memory 304 and/or displayed on a display layer 306. As described herein, the display 306 may include an interface, e.g., the display 306 may be a touch screen display.

Figure 4:
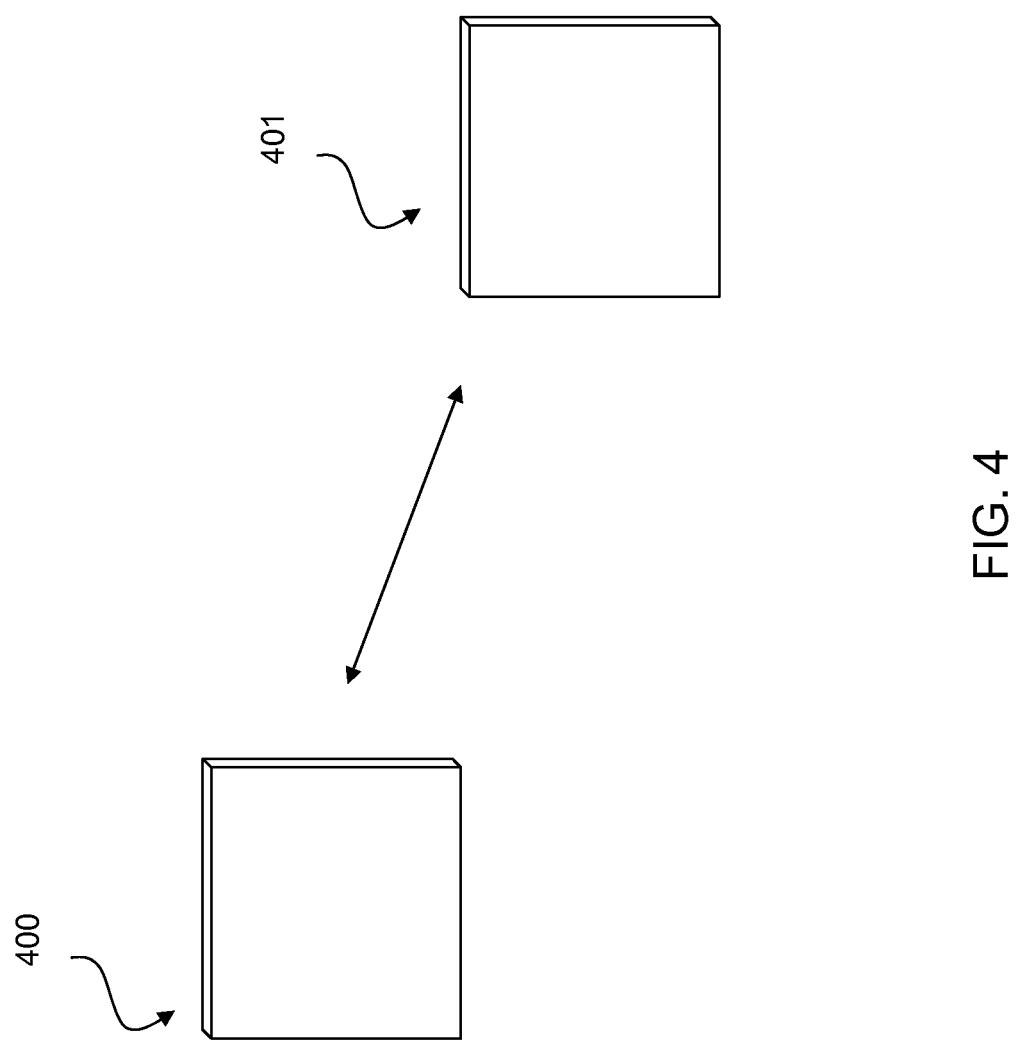
FIG. 4 illustrates an example system including a sensor with a photovoltaic power source and another device in communication therewith.

In the example of a system, such as outlined in FIG. 4, the sensor unit, e.g., 400, may include a communication component, e.g., 307, operatively coupled to the layer of transparent PV cell material 302 and at least one of the sensor 303 and the memory 304 such that the environmental data sensed may be transmitted, e.g., using a wireless communication component 307, to at least one other device 401. The at least one other device 401 may be another sensor unit, e.g., as outlined in the example unit 300, such that the sensors may coordinate data collection. Alternatively, the at least one other device 401 may be a different device entirely.

For example, a system may include a sensor unit 400 that includes components of sensor unit 300. That is, the sensor unit 400 may include a sensor 303 that captures data, a memory 304 storing data captured by the sensor 303, a PV cell 302 operatively coupled to the sensor 303 and the memory 304, a display 306 operatively coupled to the PV cell 302, and a communication component 307 that communicates the data captured by the sensor to another device 401.

The other device 401 may then receive the data captured by the sensor 303 via the communication component 307. The data captured by the sensor 303 for example may be environmental data such as temperature that is provided to another device 401 that receives the temperature data captured by the sensor 303 and uses the temperature data to commit at least one action. For example, the device 401 may receive temperature data sensed by device 400, e.g., using low powered wireless communication such as provided by a BLUETOOTH communication channel, to operate a thermostat control for indoor heating applications. Other systems are of course contemplated for making use of the sensed data, including using remotely sensed data in outdoor applications.

Thus, the various embodiments provide a sensor that derives power from a photovoltaic cell. In certain embodiments, the photovoltaic cell is provided as a transparent layer, e.g., in connection with a display device, such that a self powering sensor may be used in many applications.

As will be appreciated by one skilled in the art, various aspects may be embodied as a system, method or device program product. Accordingly, aspects may take the form of an entirely hardware embodiment or an embodiment including software that may all generally be referred to herein as a "circuit," "module" or "system." Furthermore, aspects may take the form of a device program product embodied in one or more device readable medium(s) having device readable program code embodied therewith.

It should be noted that the various functions described herein may be implemented using instructions stored on a device readable storage medium such as a non-signal storage device that are executed by a processor. A storage device may be, for example, an electronic, magnetic, optical, electromagnetic, infrared, or semiconductor system, apparatus, or device, or any suitable combination of the foregoing. More specific examples of a storage medium would include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a storage device is not a signal and "non-transitory" includes all media except signal media.

Program code embodied on a storage medium may be transmitted using any appropriate medium, including but not limited to wireless, wireline, optical fiber cable, RF, et cetera, or any suitable combination of the foregoing.

Program code for carrying out operations may be written in any combination of one or more programming languages. The program code may execute entirely on a single device, partly on a single device, as a stand-alone software package, partly on single device and partly on another device, or entirely on the other device. In some cases, the devices may be connected through any type of connection or network, including a local area network (LAN) or a wide area network (WAN), or the connection may be made through other devices (for example, through the Internet using an Internet Service Provider), through wireless connections, e.g., near-field communication, or through a hard wire connection, such as over a USB connection.

Example embodiments are described herein with reference to the figures, which illustrate example methods, devices and program products according to various example embodiments. It will be understood that the actions and functionality may be implemented at least in part by program instructions. These program instructions may be provided to a processor of a general purpose information handling device, a special purpose information handling device, or other programmable data processing device to produce a machine, such that the instructions, which execute via a processor of the device implement the functions/acts specified.

It is worth noting that while specific blocks are used in the figures, and a particular ordering of blocks has been illustrated, these are non-limiting examples. In certain contexts, two or more blocks may be combined, a block may be split into two or more blocks, or certain blocks may be re-ordered or re-organized as appropriate, as the explicit illustrated examples are used only for descriptive purposes and are not to be construed as limiting.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:

1. A device, comprising:
a sensor that produces output, wherein the sensor is an environmental sensor;
a circuit receiving the output of the sensor;
a photovoltaic cell operatively coupled to the sensor, the circuit, and a display comprising a touch interface;
the photovoltaic cell formed as a transparent layer and overlaying the display; and
a wireless communication component, wherein the wireless communication component communicates the output of the sensor to at least one other sensor unit, thereby coordinating data collection between the sensor and the at least one other sensor unit.

2. The device of claim 1, wherein the display is selected from the group consisting of a reflective display and a touch screen display.

3. The device of claim 1, further comprising a rechargeable power storing unit operatively coupled to the photovoltaic cell.

4. The device of claim 1, further comprising a wireless communication component operatively coupled to the photovoltaic cell and at least one of the sensor and the circuit.

5. The device of claim 4, wherein the wireless communication component transmits data captured by the sensor to at least one other device.

6. The device of claim 1, wherein the environmental sensor captures temperature data.

7. The device of claim 1, wherein the environmental sensor captures humidity data.

8. A method, comprising:
disposing a layer of transparent photovoltaic cell material on a device;
operatively coupling the layer of transparent photovoltaic cell material to a sensor, a circuit, and a display comprising a touch interface, wherein the sensor is an environmental sensor, wherein the layer of transparent photovoltaic cell material overlays the display;
powering the sensor, the circuit, and the display using energy derived from the layer of transparent photovoltaic cell material; and
communicating, using a wireless communication component, wherein the wireless communication component communicates the output of the sensor to at least one other sensor unit, thereby coordinating data collection between the sensor and the at least one other sensor unit.

9. The method of claim 8, further comprising storing environmental data in a memory.

10. The method of claim 9, wherein the display comprises a reflective display.

11. The method of claim 9, wherein the display comprises a touch screen display.

12. The method of claim 8, further comprising providing a wireless communication component operatively coupled to the layer of transparent photovoltaic cell material and at least one of the sensor and the circuit.

13. The method of claim 12, further comprising transmitting environmental data using the wireless communication component to at least one other device.

14. The method of claim 8, wherein the sensor captures temperature data.

15. The method of claim 8, wherein the sensor captures humidity data.

16. A system, comprising:
a sensor unit, comprising:
a sensor that captures data, wherein the sensor is an environmental sensor;
a memory storing data captured by the sensor;
a photovoltaic cell operatively coupled to the sensor, the memory, and a display comprising a touch interface;
the photovoltaic cell formed as a transparent layer and overlaying the display;
the display operatively coupled to the photovoltaic cell;
a communication component that communicates the data captured by the sensor to a device;
a device that receives the data captured by the sensor via the communication component and
a wireless communication component, wherein the wireless communication component communicates the output of the sensor to at least one other sensor unit, thereby coordinating data collection between the sensor and the at least one other sensor unit.

17. The system of claim 16, wherein:
the data captured by the sensor comprises environmental data;
the device that receives the data captured by the sensor uses the environmental data to commit at least one action.

* * * * *